United States Patent [19]

Canavello et al.

[11] 4,379,833
[45] Apr. 12, 1983

[54] SELF-ALIGNED PHOTORESIST PROCESS

[75] Inventors: Benjamin J. Canavello, Lillian, Ala.; Michael Hatzakis, Chappaqua, N.Y.

[73] Assignee: International Business Machines Corporation, Armonk, N.Y.

[21] Appl. No.: 336,467

[22] Filed: Dec. 31, 1981

[51] Int. Cl.³ .......................... H05K 3/06; H05K 3/46
[52] U.S. Cl. ..................................... 430/325; 427/96; 427/99; 430/290; 430/315; 430/326; 430/395
[58] Field of Search ................ 427/96, 99; 430/290, 430/314, 315, 327, 395, 275, 325, 326

[56] References Cited

U.S. PATENT DOCUMENTS 4,174,219  11/1979  Andres et al. ................. 430/321
4,293,624  10/1981  Buckley .......................... 427/96

FOREIGN PATENT DOCUMENTS 55-153938  12/1980  Japan .............................. 430/290

*Primary Examiner*—John D. Smith
*Attorney, Agent, or Firm*—Ronald L. Drumheller

[57] ABSTRACT

A self-aligned photoresist process for selectively covering a pattern on a substrate with photoresist without using a mask or needing an alignment step. It may be used when the pattern to be covered or not covered has a much different reflectivity than the non-pattern areas. A photoresist layer is deposited over the substrate and exposed to a flood beam. The higher reflectivity regions reflect much more exposing radiation and cause increased exposure in the regions overlying the higher reflectivity pattern. Upon development, the more exposed regions (or in the case of a negative resist, the less exposed regions) preferentially develop away, leaving a resist pattern corresponding with the reflective pattern and aligned therewith. This process can be used, for example, to cover a substrate with resist everywhere except at metallized areas.

8 Claims, 7 Drawing Figures

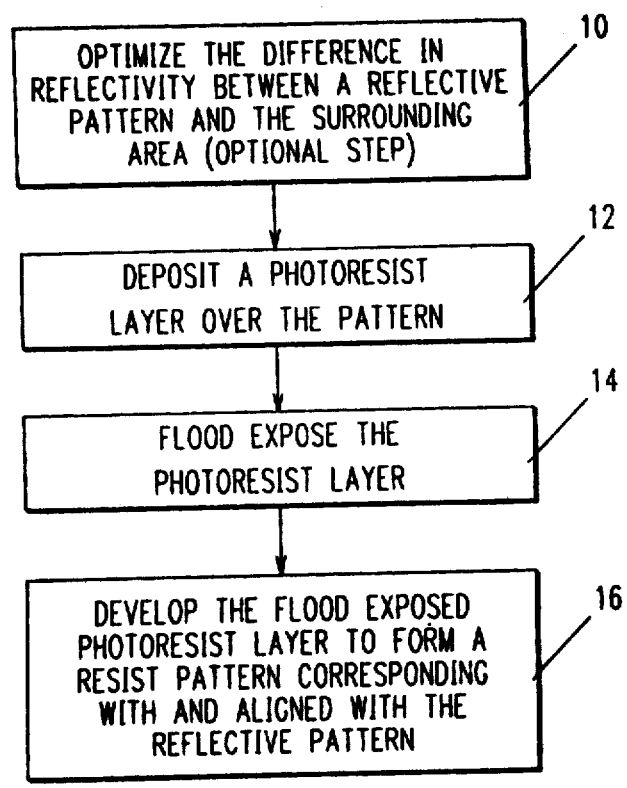

FIG. 2.1
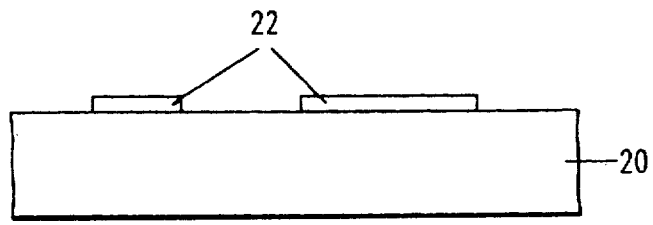
FIG. 2.2
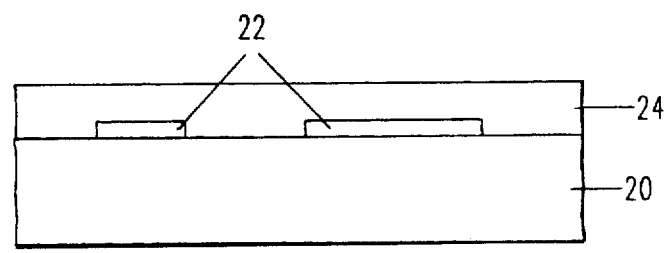
FIG. 2.3
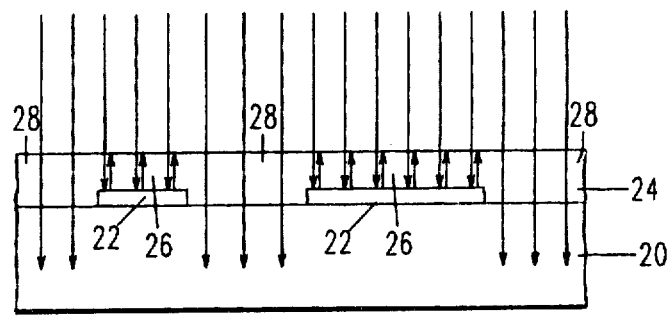

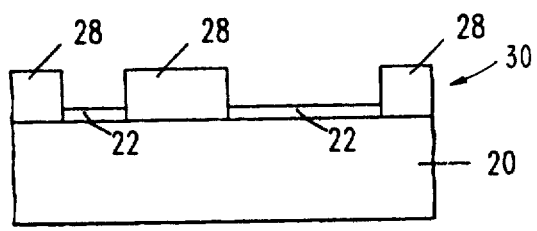
FIG. 2.4
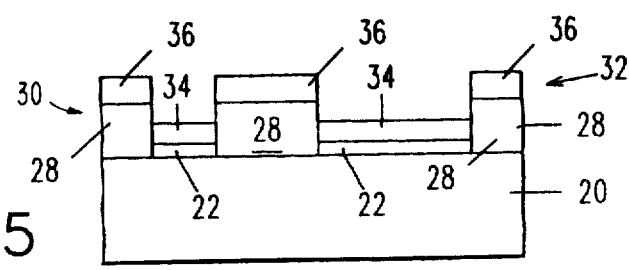
FIG. 2.5
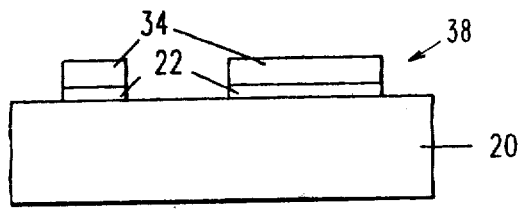
FIG. 2.6

SELF-ALIGNED PHOTORESIST PROCESS

DESCRIPTION

TECHNICAL FIELD

This invention relates to photoresist processes and more particularly it relates a method for selectively covering a pattern on a substrate with resist without using a mask or needing an alignment step.

BACKGROUND ART

In the manufacture of electronic microcircuits the need arises in some integrated circuit fabrication processes to form a patterned resist layer on top of a previously formed patterned material layer where the patterned resist layer to be fabricated either has the same pattern as the underlying previously formed material pattern or has the complementary pattern thereof. A patterned resist layer of this kind may be used to either selectively cover or to selectively uncover an underlying patterned material layer for a subsequent selective treatment step. The treatment may involve material deposition, material removal, or material modification. For example, material may be selectively coated onto the patterned layer to build a desired laminate pattern using a lift-off technique. This might be used, for example where the thickness of a metal pattern needs to be increased or a surface characteristic changed for some reason. This need arises because thin metal patterns are most easily defined lithographically while thick metal patterns are more desired because they are electrically more conductive and form better masking patterns. The ability to easily and conveniently convert a thin metal pattern to a thick metal pattern is thus very useful.

One prior art method for accomplishing this step is to coat the previously formed pattern with a photoresist layer, align a suitably patterned photomask to the underlying pattern, expose the photoresist layer through the aligned mask, and then develop the exposed photoresist layer. If the photomask was identical with or the exact complement of the underlying material pattern, then the developed photoresist layer will either exactly cover or not cover the underlying pattern. One drawback of this prior art method is that a suitably patterned photomask is required. Another disadvantage is that precise alignment is required. If the underlying pattern has experienced a heat cycle after formation, distortion usually occurs, which makes exact overlay and accurate alignment impossible.

Where the underlying pattern is a metal and the treatment step consists of the addition of more metal, electroplating and electroless plating have also been used in the prior art. A disadvantage of electroplating is that all of the metal pattern parts must be electrically interconnected, a requirement which is not often met in practice. Electroless plating has other disadvantages, such as a tendency to have non-uniform plating thickness. In both cases, the parts of the structure not covered by the metal pattern are also exposed to the plating solution and thus become contaminated.

DISCLOSURE OF INVENTION

All of these disadvantages are avoided by our invention in which a self-aligned photoresist process is used to selectively cover a pattern on a substrate with photoresist without using a mask or needing an alignment step. It is useful when the pattern to be covered or not covered has a much different reflectivity than the non-pattern areas. A photoresist layer is deposited over the substrate and exposed to a flood beam. The higher reflectivity regions reflect much more exposing radiation and cause increased exposure in the regions overlying the higher reflectivity pattern. Upon development, the more exposed regions (or in the case of a negative resist, the less exposed regions) preferentially develop away, leaving a resist pattern corresponding with the reflective pattern and aligned therewith. This process can be used, for example, to cover a substrate with resist everywhere except at metallized areas.

BRIEF DESCRIPTION OF THE DRAWINGS

FIG. 1 is a block diagram of the steps in our photoresist process.

FIGS. 2.1–2.6 illustrate our photoresist process in cross-section step-by-step during fabrication of a multilayer metallic pattern.

BEST MODE FOR CARRYING OUT THE INVENTION

Our invention will now be described in further detail by referring to FIG. 1 in which our method is illustrated in block diagram and by referring to FIGS. 2.1–2.6 which illustrate a preferred embodiment in cross-section step-by-step.

In this illustrated embodiment a substrate 20 (FIG. 2.1) carries a metallic pattern 22 which is to be selectively coated with another material. This step typically occurs, for example, in multi-layer ceramic integrated circuit technology, where ceramic sheets are patterned with metallic paste, laminated and fired. Better adhesion characteristics are typically desired for the metallic pattern areas which are to be contacted with solder, so that it becomes desirable to be able to deposit additional (and typically different) metal on the top metallic pattern of a multi-layer ceramic substrate.

Since the difference in reflectivity between a reflective pattern and the surrounding area is to be used to form a self-aligned patternwise exposure of an overlying photoresist layer, it is important that the difference in reflectivity be suitably large. Therefore, it is desirable to optimize this difference in reflectivity in a first step 10 (FIG. 1). It should be apparent that if the difference in reflectivity is already suitably large, then this first step is optional.

In a second step 12 (FIG. 1), the polished metallic pattern is covered wth a layer of photoresist 24 (FIG. 2.2). Any suitable photoresist may be used, such as AZ 1350 (AZ is a trademark of the Shipley Co.). For the purpose of illustration, a positive photoresist is described. It should be apparent that a negative photoresist could be used as well to obtain a complementary self-aligned resist pattern.

The deposited resist layer is next flood exposed 14 (FIG. 1) to actinic radiation, such as ultraviolet light. The UV light passes through the photoresist layer 24 and in the more highly relective regions corresponding with the metallic pattern 22 becomes largely reflected back upwards through the resist layer. In the less highly reflective regions outside the metallic pattern, the UV light largely passes into the substrate 20 and becomes absorbed.

What has been illustrated in FIG. 2.3 is the ideal situation where the reflective pattern 22 totally reflects UV light (represented by the up turned arrows) and the non-reflective areas totally absorb UV light (represented by the arrows penetrating the substrate 20). In a practical situation UV light is partly reflected and partly absorbed in both regions, but the more highly reflective pattern reflects much more of the UV light than does the less reflective surrounding area. A difference in exposure thus results with respect to photoresist regions 26 overlying more highly reflective areas in comparison with photoresist regions 28 overlying less highly reflective areas. For a positive resist, the more highly exposed resist regions overlying relatively more reflective areas dissolve more readily in a developer solution than do the less highly exposed resist regions overlying relatively less reflective areas. The degree to which this difference in dissolution rate occurs with respect to a given difference in exposure is referred to as the contrast of the resist. It is preferred that a high contrast resist be used in order to reduce the need for a very high difference in reflectivity. Also, as will be apparent to those of ordinary skill in resist technology, a higher resist contrast will reduce the amount of resist thickness lost in the less highly exposed regions during complete development of the more highly exposed regions. Thus, with a higher contrast resist, the initial resist layer thickness need not be as great and better resolution occurs.

In the final step 16 (FIG. 1), the exposed resist layer is developed to the point where the more highly exposed regions 26 have been completely dissolved away (FIG. 2.4), leaving a resist pattern 30 consisting of the less highly exposed regions 28. The resulting resist pattern corresponds with and is perfectly aligned with the reflective layer.

The self-aligned corresponding resist pattern may now be used in any manner and for any purpose that resist patterns are used. It may be used to selectively deposit material by an evaporation or plating or sputtering technique, for example. Also, it may be used to selectively remove material by any suitable process such as by chemical or ion etching for the purpose of cleaning or polishing or for some other purpose. Alternatively it may be used to selectively modify the exposed regions, for example by chemical treatment or by ion bombardment.

For purpose of illustration, in FIG. 2.5 a metallic layer 32 has been evaporated over the resist pattern. The metallic layer covers the underlying reflective pattern 22 (regions 34) as well as the resist pattern 30 (regions 36) and has intermediate discontinuity. When the resist pattern 30 is removed (FIG. 2.6), the metallic layer regions 36 overlying the resist pattern are also removed (a lift-off process), leaving the original pattern 22 now covered with an identical and aligned metallic pattern 38 consisting of regions 34.

EXAMPLE

1. A ceramic substrate, carrying a metal pattern, was polished with 0.3 micron aluminum oxide in water on a pressed cloth affixed to a plate of glass.
2. The substrate was cleaned ultrasonically in a solution of detergent and water for 30 minutes (to remove the powder from the substrate) and rinsed in water.
3. Shipley AZ1350J photoresist was applied by spinning to a thickness of 2-3 microns.
4. The resist was baked at 70° C. in air for 30 minutes and cooled to room temperature.
5. The resist-coated substrate was then exposed to the radiation from a 200 watt high pressure mercury arc at about 6 inches distance for 5 seconds.
6. The work piece was next immersed in "AZ developer" diluted with an equal portion of water for 30 seconds.
7. 1000 A of aluminum plus 3000 A of gold were then evaporated, in vacuum, upon the substrate.
8. Finally, the substrate was soaked in ethyl cellosolve acetate to remove the resist and the unwanted metal above it.

The result was an aluminum-gold laminate over the metal areas and clean ceramic everywhere else.

Many modifications to and variations of this process should be apparent to those of ordinary skill in microcircuit lithography and may be made without departing from the spirit and scope of our invention. A negative photoresist, for example, would selectively cover the reflective pattern so that the complementary less reflective regions could be preferentially treated instead of the more reflective regions. This might be used, for example, to etch or clean the less reflective regions or to modify the edge profile of the reflective pattern in order to decrease the overcut or increase the undercut of the edge profile.

Having thus described our invention, what we claim as new, and desire to secure by Letters Patent is:

1. A self-aligned photoresist process, comprising the steps of:
   depositing a layer of photoresist over a substrate surface, said surface having a pattern of areas with substantially higher reflectivity than surrounding areas in a wavelength region in which said photoresist is sensitive:
   flooding the deposited photoresist layer with light in said wavelength region, the greater reflection of light at the pattern areas of higher reflectivity causing greater exposure of the photoresist layer in regions overlying said pattern areas of higher reflectivity; and
   developing the flooded photoresist layer thereby producing a resist pattern corresponding with the pattern areas of higher reflectivity and aligned therewith.

2. A photoresist process as defined in claim 1 wherein the photoresist is positive acting and the resist pattern is substantially identical with and overlies the surface areas surrounding the pattern areas of higher reflectivity.

3. A photoresist process as defined in claim 2 and further comprising the step of depositing a metallic layer through the resist pattern and on top of the pattern areas of higher reflectivity.

4. A photoresist process as defined in claim 3 wherein said metallic layer is vapor deposited.

5. A photoresist process as defined in claim 3 and further comprising the step of removing the resist pattern.

6. A photoresist process as defined in claim 1 and further comprising the step of polishing the pattern of areas of higher reflectivity to improve the reflectivity of said pattern of areas with respect to surrounding areas.

7. A photoresist process as defined in claim 1 wherein said wavelength region is in the ultraviolet region.

8. A photoresist process as defined in claim 1 wherein the photoresist is negative acting and the resist pattern is substantially identical with and overlies the pattern areas of higher reflectivity.

* * * * *